US009547202B2

(12) United States Patent
Lo et al.

(10) Patent No.: US 9,547,202 B2
(45) Date of Patent: Jan. 17, 2017

(54) TRANSPARENT DISPLAY PANEL (71) Applicant: INDUSTRIAL TECHNOLOGY RESEARCH INSTITUTE, Chutung, Hsinchu (TW)

(72) Inventors: Kuo-Lung Lo, New Taipei (TW); Wen-Lung Chen, Zhunan Township (TW); Wen-Tung Wang, Zhudong Township (TW); Kuo-Chang Lee, Pingtung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/884,409

(22) Filed: Oct. 15, 2015

(65) Prior Publication Data
US 2016/0178972 A1    Jun. 23, 2016

(30) Foreign Application Priority Data
May 22, 2015 (TW) .............................. 104116422 A (51) Int. Cl.
*H01L 27/12* (2006.01)
*G02F 1/1343* (2006.01)
*G02F 1/1368* (2006.01)
*G02F 1/1362* (2006.01)

(52) U.S. Cl.
CPC ....... *G02F 1/134309* (2013.01); *G02F 1/1368* (2013.01); *G02F 1/136213* (2013.01); *G02F 1/136286* (2013.01); *H01L 27/124* (2013.01); *H01L 27/1218* (2013.01); *H01L 27/1255* (2013.01)

(58) Field of Classification Search
CPC . H01L 27/124; H01L 27/1255; H01L 27/1218
See application file for complete search history.

(56) References Cited

U.S. PATENT DOCUMENTS

| 8,227,797 | B2 | 7/2012 | Seo |
| 8,400,383 | B2 | 3/2013 | Cho et al. |
| 8,550,667 | B2 | 10/2013 | Kim et al. |
| 8,558,222 | B2 | 10/2013 | Hwang et al. |
| 8,684,547 | B2 | 4/2014 | Kim et al. |

(Continued)

FOREIGN PATENT DOCUMENTS

| CN | 103487989 A | 1/2014 |
| CN | 103713439 A | 4/2014 |

(Continued)

OTHER PUBLICATIONS

Chou et al., "Roll-to-roll fabrication of a low-reflectance transparent conducting oxide film with subwavelength structures", Journal of Micromechanics and Microengineering, 2012, 22, 045009, 7 Pages.

(Continued)

*Primary Examiner* — Douglas Menz
(74) *Attorney, Agent, or Firm* — Birch, Stewart, Kolasch & Birch, LLP (57) ABSTRACT

A transparent display panel includes a substrate and a pixel array. The pixel array is formed on the substrate and includes a plurality of data lines and a plurality of scan lines. The data lines and the scan lines surround a plurality of pixel regions. Each pixel region defines a transparent region and an opaque region, wherein each transparent region occupies a relative position in the corresponding pixel region and at least three relative positions successively arranged along an axial direction are different.

15 Claims, 11 Drawing Sheets

(56) References Cited

U.S. PATENT DOCUMENTS

| | | |
|---|---|---|
| 8,743,466 B2 | 6/2014 | Yamamoto |
| 8,766,959 B2 | 7/2014 | Taneda et al. |
| 2007/0057932 A1 | 3/2007 | Shin et al. |
| 2007/0138941 A1 | 6/2007 | Jin et al. |
| 2008/0073653 A1 | 3/2008 | Iwasaki |
| 2010/0013741 A1 | 1/2010 | Watanabe |
| 2010/0079870 A1 | 4/2010 | Cao |
| 2010/0208497 A1 | 8/2010 | Song et al. |
| 2012/0327498 A1 | 12/2012 | Arai et al. |
| 2013/0050798 A1 | 2/2013 | Kim et al. |
| 2014/0042475 A1 | 2/2014 | Park et al. |

FOREIGN PATENT DOCUMENTS

| | | | |
|---|---|---|---|
| TW | 200517755 | A | 6/2005 |
| TW | 200834929 | A | 8/2008 |
| TW | 200930141 | A | 7/2009 |
| TW | 200949401 | A | 12/2009 |
| TW | 201128771 | A1 | 8/2011 |
| TW | 201209489 | A | 3/2012 |
| TW | 201327514 | A1 | 7/2013 |
| TW | 201411259 | A | 3/2014 |

OTHER PUBLICATIONS

Fujisaki et al., "Transparent Nanopaper-Based Flexible Organic Thin-Film Transistor Array", Adv. Funct. Mater., 2014, 24, 1657-1663.

Lee et al., "Cavity effect of transparent organic emitting device using metal cathode", Organic Optoelectronics and Photonics, Proceedings of SPIE, 2004, vol. 5464, pp. 306-313.

Lo et al., "Recent Development of Transparent Electrowetting Display", SID, Digest, 2013, pp. 123-126.

Mun et al., "A high transmittance color liquid crystal display mode with controllable color gamut and transparency", Optical Society of America, May 19, 2014, vol. 22, No. 10, pp. 12505-12512.

Nathan et al., "Transparent Oxide Semiconductors for Advanced Display Applications", Frontline Technology, Information Display, 2013, 1/13, pp. 6-10.

Park et al., "Development of Oxide TFT and Application to the Transparent Display", AMD7-1, Invited, IDW, 2011, pp. 1665-1668.

Su et al., "A New Polymer Dispersed Liquid Crystal Applied in Active-matrix TFT Transparent Display", LCT5-3, IDW/AD, 2012, pp. 1573-1576.

Su et al., "Polymer-Dispersed Liquid Crystal Applied in Active-Matrix Transparent Display", Journal of Display Technology, Aug. 2014, vol. 10, No. 8, pp. 683-687.

Yu et al., "Design of a cholesteric liquid crystal cell for a high-transmittance light shutter", Proc. of SPIE, 2014, vol. 9004, pp. 90040L-1-90040L-5.

Taiwanese Office Action and Search Report for Taiwanese Application No. 104116422, dated Mar. 25, 2016.

Oh et al., "Highly efficient full-color display based on blue LED backlight and electrochromic light-valve coupled with front-emitting phosphors," Optics Express, vol. 19, No. 17, Aug. 15, 2016, 10 pages.

Taiwanese Office Action and Search Report, dated Aug. 29, 2016, for Taiwanese Application No. 104115852.

TRANSPARENT DISPLAY PANEL

This application claims the benefit of U.S. provisional application Ser. No. 62/094,072, filed Dec. 19, 2014, the subject matter of which is incorporated herein by reference, and claims the benefit of Taiwan application Serial No. 104116422, filed May 22, 2015, the subject matter of which is incorporated herein by reference.

TECHNICAL FIELD

The disclosure relates to a display panel, and also relates to a transparent display panel.

BACKGROUND

A display panel defines several pixel regions. Each pixel region includes light-passable and light-impassable elements. The light-passable and light-impassable elements are periodically arranged in the pixel regions. Therefore, when the light penetrates the light-passable elements between two pixel regions, the light will be diffracted and affect the display quality. For example, the image may become blurred.

SUMMARY

According to one embodiment, a transparent display panel is provided. The transparent display panel includes a substrate and a pixel array. The pixel array is formed on the substrate and includes a plurality of data lines and a plurality of scan lines. The scan lines and the data lines surround a plurality of pixel regions separated from each other. Each pixel region defines an opaque region and a transparent region. The transparent region has an area equivalent to at least 50% of the corresponding pixel region and a transmittance greater than or substantially equivalent to 30%, and the transparent region occupies a relative position in the corresponding pixel region, wherein at least three relative positions successively arranged along an axial direction are different.

According to another embodiment, a transparent display panel is provided. The transparent display panel includes a substrate and a pixel array. The pixel array is formed on the substrate and includes a plurality of data lines and a plurality of scan lines. The scan lines and the data lines surround a plurality of pixel regions separated from each other. Each pixel region defines an opaque region and a transparent region. The transparent region has an area equivalent to at least 50% of the corresponding pixel region and a transmittance greater than or substantially equivalent to 30%, and the transparent region occupies a relative position in the corresponding pixel region, wherein at least four relative positions successively arranged along an axial direction are different.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1A:
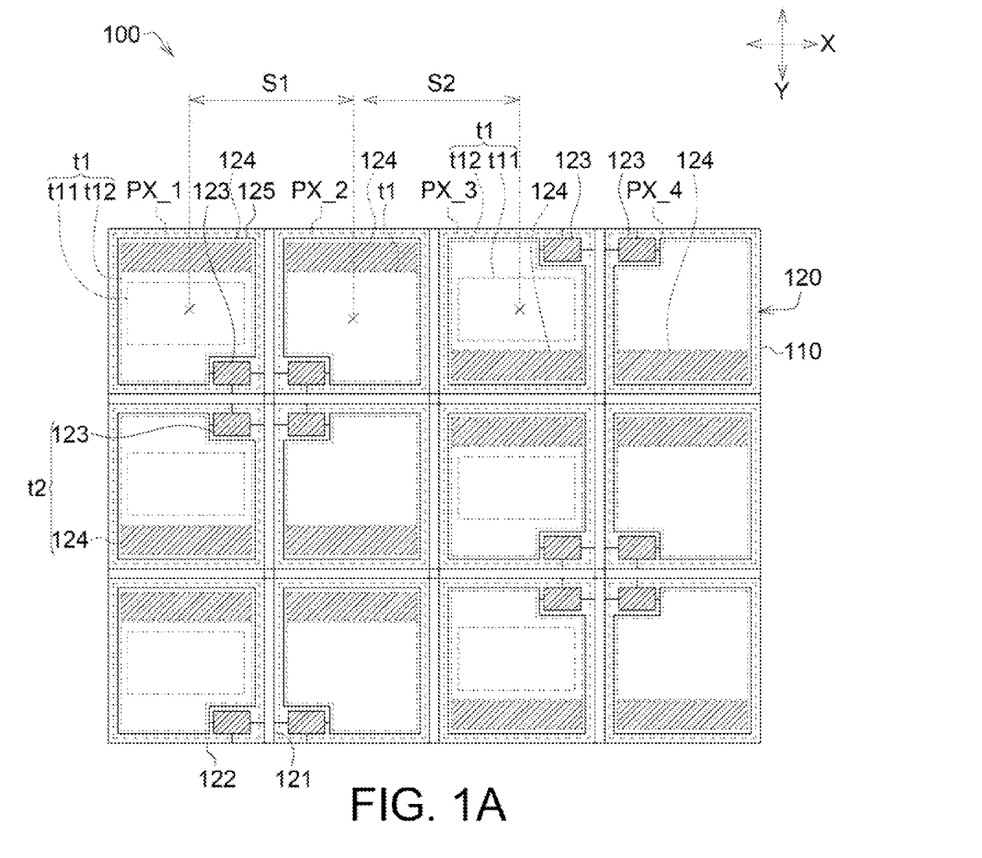
FIG. 1A is a top view of a transparent display panel according to an embodiment of the disclosure.

FIG. 1A is a top view of a transparent display panel according to an embodiment of the disclosure. The transparent display panel 100 can be realized by such as a liquid crystal display panel, an RGB side by side organic light emitting diode display panel (RGB side by side OLED panel), a white organic light emitting diode with color filter (WOLED with color filter) or an electrowetting display panel. The transparent display panel 100 of the present embodiment is exemplified by a liquid crystal display panel. The display panel 100 of the embodiment of the disclosure is transparent, and allows the user to view the object or scene at the rear of the display panel 100 and the image displayed on the display panel 100 at the same time. In addition, the transparent display panel 100 can be assembled to a display device (not illustrated), which selectively includes a light source module (not illustrated) disposed opposite to the transparent display panel 100.

The transparent display panel 100 includes a first substrate 110, a pixel array 120, a second substrate (not illustrated) and a liquid crystal layer (not illustrated), wherein the liquid crystal layer is formed between the first substrate 110 and the second substrate. The pixel array 120 is formed on the first substrate 110, and includes a plurality of data lines 121, a plurality of scan lines 122, a plurality of active elements 123, a plurality of capacitor electrodes 124 and a plurality of pixel electrodes 125. The scan lines 122 and the data lines 121 surround a plurality of pixel regions PX which are separated from each other by the scan lines 122 and the data lines 121. Each of the active elements 123, capacitor electrodes 124 and pixel electrodes 125 is located in a corresponding pixel region PX. At least two pixel regions PX have a similar shape and/or area. For example, the shape of each pixel region PX of the present embodiment is a rectangle, and/or the area of each pixel region PX is approximately the same.

Each pixel region PX defines an opaque region t2 and a transparent region t1. If the area of the transparent region t1 is less than 50% of the corresponding pixel region PX, the wavelength of red light may be diffracted after the light penetrates the transparent region t1. Each transparent region t1 of the embodiment of the disclosure has an area equivalent to at least 50% of the corresponding pixel region PX, hence destroying the optical diffraction which may deteriorate the display quality.

Moreover, each transparent region t1 has a transmittance greater than or substantially equivalent to 30%, such that the spatial resolution recognizable to human eyes' can reach 4 lp/mm. In greater details, human eyes' spatial resolution for objects decreases along with the increase in observation distance and decrease in brightness. When a viewer uses his/her eyes to observe an object more than 40 cm away, the resolution limit of human eyes is about 4 lp/mm (4 pairs of black and white patterns per millimeter), and any images with a resolution higher than the said resolution limit are unrecognizable to human eyes. When the viewer uses his/her human eyes to observe the object through a filter with a transmittance of 25%, the object with a spatial resolution of 4 lp/mm is still recognizable to the human eyes. When the transmittance is lower than 25%, the recognizable spatial resolution will decrease. For example, when the transmittance is 15%, any objects with a spatial resolution between 3.2 lp/mm~4 lp/mm will become unrecognizable. In short, since each transparent region t1 of the present embodiment has a transmittance greater than or substantially equivalent to 30%, the spatial resolution recognizable to human eyes will be higher than 4 lp/mm.

The opaque region t2 includes all light-impassable parts of the pixel region PX, such as active elements, capacitor electrodes, black matrixes, data lines, scan lines, and other elements formed of metals or non-metals. In a pixel region PX, all parts other than the opaque region t2 are defined as the transparent region t1. In the present embodiment; the active elements 123, the capacitor electrodes 124, a part of the data lines 121 and/or a part of the scan lines 122 can be located in the opaque region t2. The part of the pixel electrode 125 overlapping the capacitor electrode 124 is located in the opaque region t2. The part of the pixel electrode 125 not overlapping the capacitor electrode 124 is located in the transparent region t1.

The transparent region t1 occupies a relative position in the corresponding pixel region PX, wherein at least three relative positions successively arranged along an axial direction are different, hence destroying the optical diffraction and improving the display quality. For example, when the user views an object or scene at the rear of the display panel, the image of the object or scene will not be blurred. For example, in the present embodiment, at least three relative positions of the active elements 123 and the capacitor electrodes 124 successively arranged along an axial direction are different, such that at least three relative positions of the transparent regions t1 successively arranged along the same axial direction are different. Here, the axial direction refers to the X-axial direction or the Y-axial direction.

In the present disclosure, "relative positions are different" refers to the center positions or centroid positions of the geometric shapes being different. When the shape, area, and/or position of a transparent region t1 changes, relative position of the transparent region t1 in the pixel region will change accordingly. Or, each transparent region t1 has a centroid coordinate in a pixel region PX, and the coordinates of three centroids of at least three transparent regions t1 successively arranged along the same axial direction are different. In addition, the at least three pixel regions successively arranged along the same axial direction basically have the same area. As long as at least one of the position, shape and area of the opaque region t2 and/or the transparent region t1 changes, relative position of the transparent region t1 in the corresponding pixel region PX will change accordingly.

As indicated in FIG. 1A, four pixel regions PX_1, PX_2, PX_3 and PX_4 are successively arranged along the X-axis. Relative position between the active element 123 and the capacitor electrode 124 in the pixel region PX_1, relative position between the active element 123 and the capacitor electrode 124 in the pixel region PX_2, relative position between the active element 123 and the capacitor electrode 124 in the pixel region PX_3, and relative position between the active element 123 and the capacitor electrode 124 in the pixel region PX_4 are different. Therefore, relative positions of the opaque regions t2 will be different, and relative positions of the four transparent regions t1 successively arranged along the same axial direction will also be different.

Furthermore, the active element 123 occupies a relative position at the bottom-right corner in the pixel region PX_1, the active element 123 occupies a relative position at the bottom-left corner in the pixel region PX_2, the active element 123 occupies a relative position at the top-right corner in the pixel region PX_3, and the active element 123 occupies a relative position at the top-left corner in the pixel region PX_4, such that relative positions of the four transparent regions t1 successively arranged along the same axial direction are different. Thus, the optical diffraction which occurs when the light penetrates the pixel regions can be destroyed and the display quality can be improved.

As indicated in FIG. 1A, the transparent region t1 includes a first transparent region t11 and a second transparent region t12. The first transparent region t11 has a transmittance greater than that of the second transparent region t12. For example, the first transparent region t11 has a transmittance greater than 50%, such that the overall transmittance of the pixel region PX can be increased. Under such design, even though the transmittance of the second transparent region t12 is less than 50%, the overall transmittance of the pixel region PX still can be effectively maintained or increased.

Moreover, if the transparent regions t1 of several pixel regions PX have at least two different sets of spaces, the optical diffraction which occurs when the light penetrates the pixel regions will be destroyed. Here, "space" refers to such as the distance between the geometric centers or centroids of two transparent regions t1.

As indicated in FIG. 1A, three pixel regions PX_1, PX_2 and PX_3 are successively arranged along the X-axis. The space S1 between the transparent region t1 in the pixel region PX_1 and the transparent region t1 in the pixel region PX_2 is different from the space S2 between the transparent region t1 in the pixel region PX_2 and the transparent region t1 in the pixel region PX_3, such that the three pixel regions PX_1, PX_2 and PX_3 have two different sets of spaces, hence destroying the optical diffraction which occurs when the light penetrates the pixel regions. In another embodiment, the transparent regions t1 of several pixel regions successively arranged along the same axis can have more than two different sets of spaces which can change gradually. For example, the different sets of spaces can gradually swell or shrink. Or, the different sets of spaces can gradually swell and gradually shrink alternately. For example, the spaces can gradually swell and then shrink, or gradually shrink and then swell.

In another embodiment, N pixel regions PX successively arranged along the same axial direction can form N-m different sets of spaces, wherein, N is a positive integer equivalent to or greater than 3, and "m" is a positive integer between N-2 and 1. For example, if 20 pixel regions PX are successively arranged along the same axial direction (that is, N=20), then 2~19 different sets of spaces can be formed between the 20 pixel regions PX. The actual number of sets of spaces is determined according to the target display quality, and is not subjected to any restrictions in the embodiment of the disclosure. The larger the number of sets of spaces formed between the pixel regions PX, the better the effect of destroying the optical diffraction and improving the display quality.

Relative positions of transparent regions t1 of the disclosure are not limited to the above embodiments, and can be realized by other implementations exemplified in FIGS. 1B~1D below.

Figure 1B:
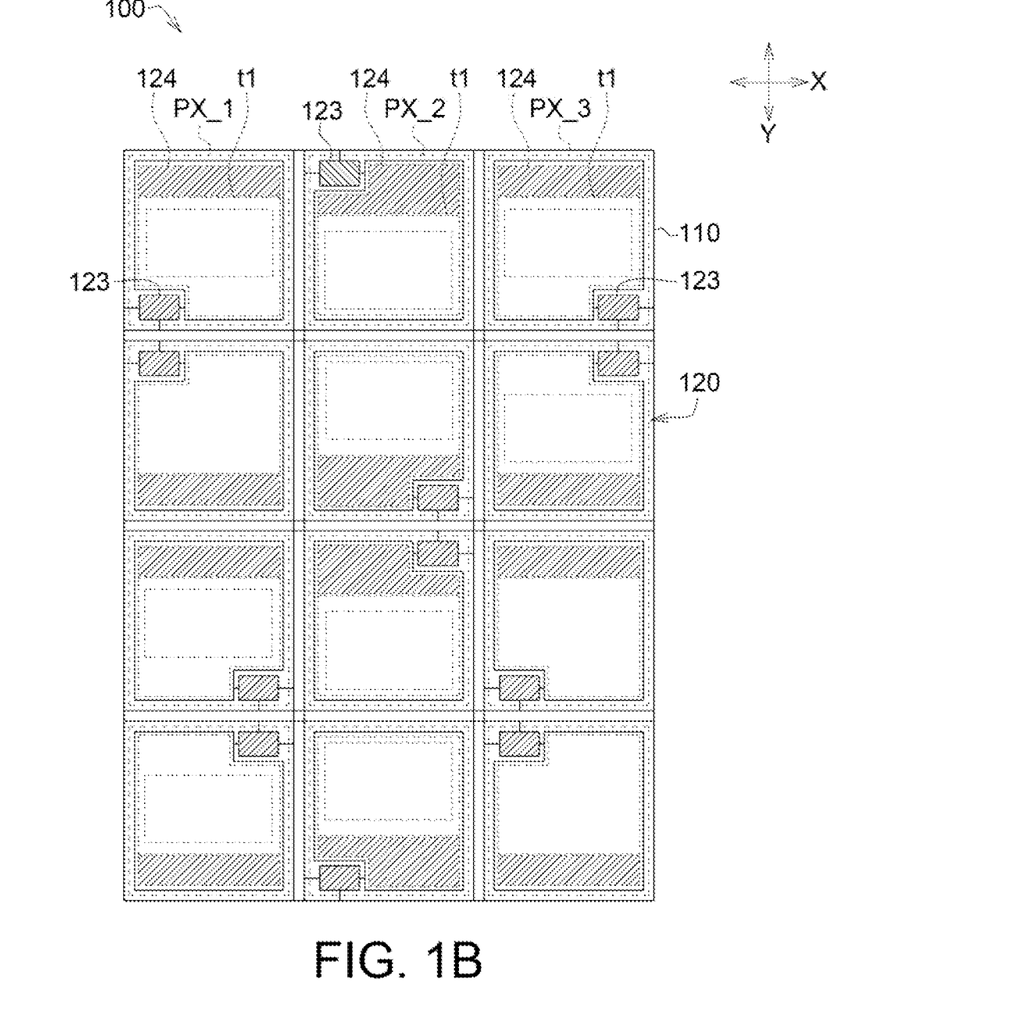
FIGS. 1B~1D are other implementations of the transparent display panel of FIG. 1A.
Figure 1C:
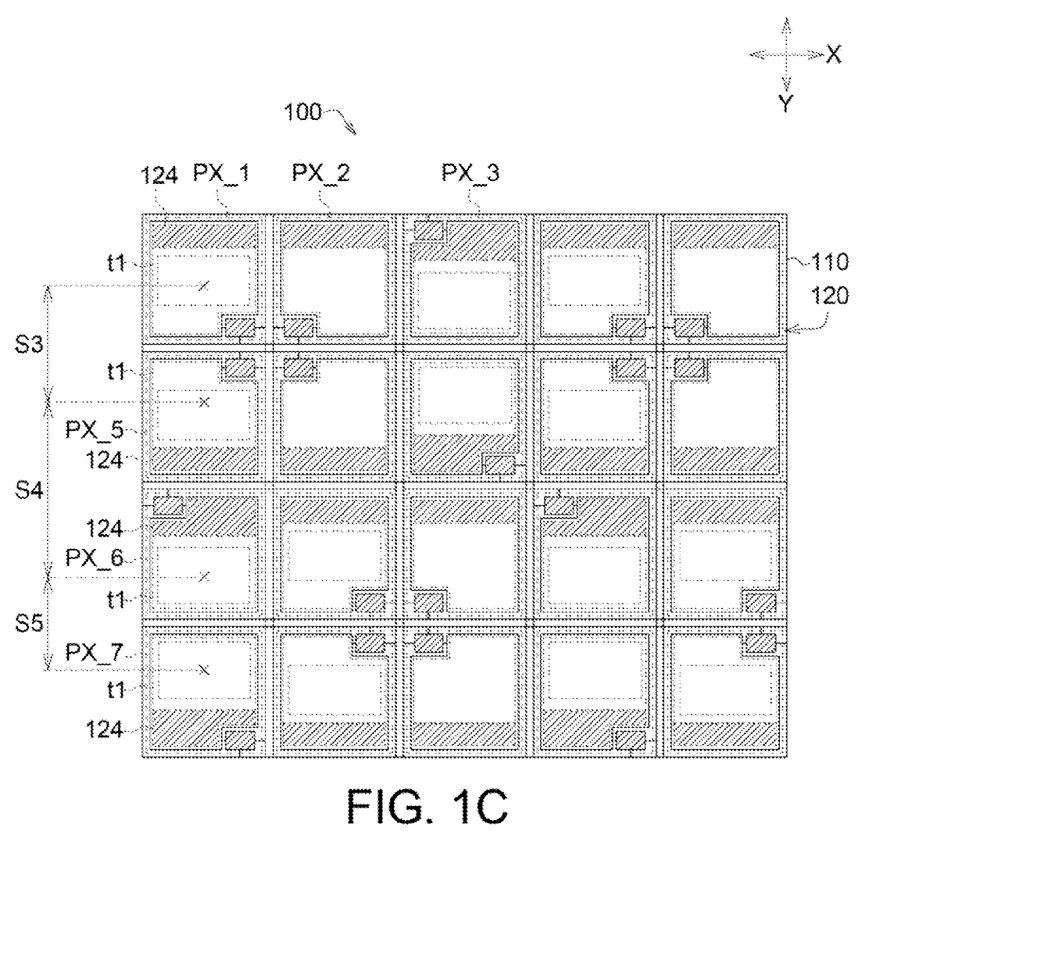
Figure 1D:
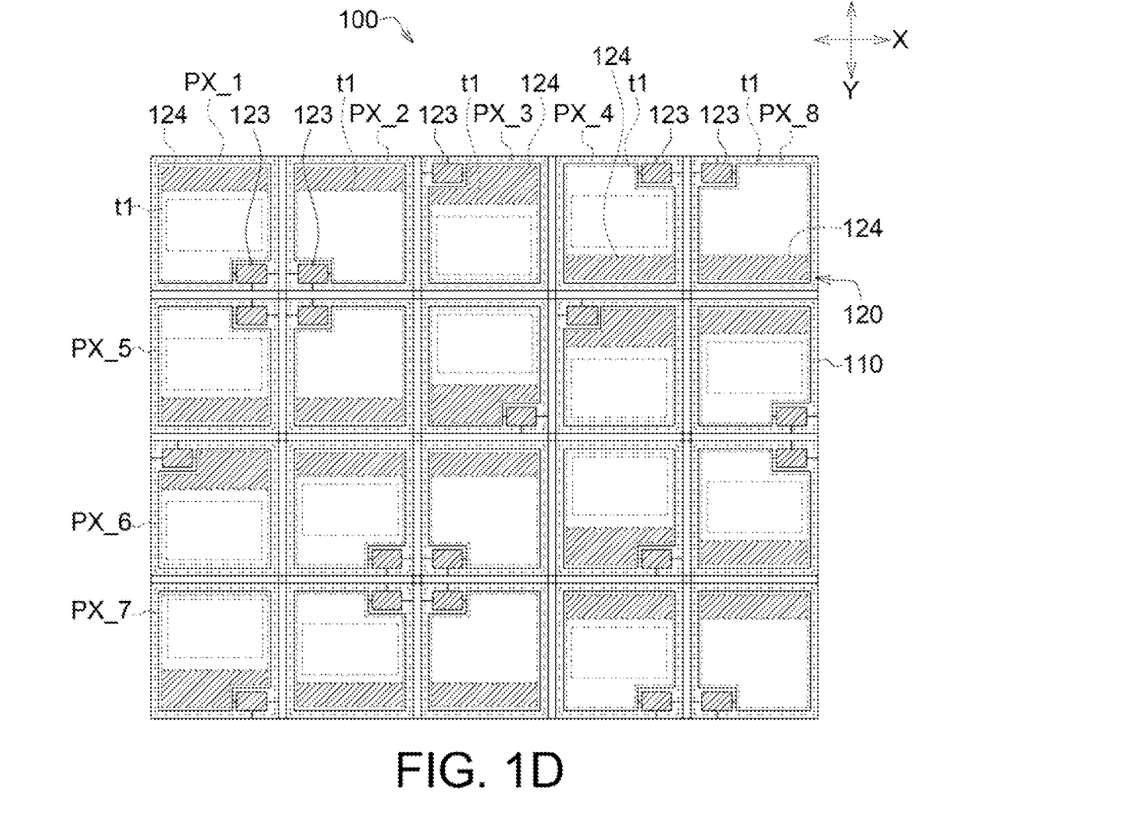

FIGS. 1B~1D are other implementations of the transparent display panel of FIG. 1A. In comparison to the transparent display panel 100 of FIG. 1A, the transparent display panel 100 of FIG. 1B includes three transparent regions t1, which are successively arranged along the X-axis and have different relative positions.

As indicated in the transparent display panel 100 of FIG. 1C, relative positions of the three transparent regions t1 successively arranged along the X-axis are different, and relative positions of the four transparent regions t1 successively arranged along the Y-axis are also different.

Let the pixel regions PX_1, PX_5, PX_6 and PX_7 successively arranged along the Y-axis be taken for example. The active element 123 occupies a relative position at the bottom-right corner in the pixel region PX_1. The active element 123 occupies a relative position at the top-right corner in the pixel region PX_5. The active element 123 occupies a relative position at the top-left corner in the pixel region PX_6. Thus, relative positions of the transparent region t1 in the pixel region PX_1, the transparent region t1 in the pixel region PX_5 and the transparent region t1 of pixel region PX_6 are different. Although both the relative position of the active element 123 in the pixel region PX_1 and the relative position of the active element 123 in the pixel region PX_7 are at the bottom right corner, the position of the capacitor electrode 124 (the opaque region) in the pixel region PX_1 is different from the position of the capacitor electrode 124 (the opaque region) in the pixel region PX_7, and the relative positions of the transparent region t1 in the pixel region PX_1 and the transparent region t1 in the pixel region PX_7 vary accordingly. Thus, the relative positions of the transparent regions t1 in the four pixel regions PX_1, PX_5, PX_6 and PX_7 successively arranged along the Y-axis are different.

Let the pixel regions PX_1, PX_5, PX_6 and PX_7 successively arranged along the Y-axis be taken for example. The space S3 between the transparent region t1 in the pixel region PX_1 and the transparent region t1 in the pixel region PX_5, the space S4 between the transparent region t1 in the pixel region PX_5 and the transparent region t1 in the pixel region PX_6, and the space S5 between the transparent region t1 in the pixel region PX_6 and the transparent region t1 in the pixel region PX_7 are three different spaces between the four pixel regions PX_1, PX_5, PX_6 and PX_7, hence destroying the optical diffraction which occurs when the light penetrates the pixel regions.

As indicated in the transparent display panel 100 of FIG. 1D, relative positions of the five transparent regions t1 successively arranged along the X-axis are different, and relative positions of the four transparent regions t1 successively arranged along the Y-axis are also different.

Let the five pixel regions PX_1, PX_2, PX_3, PX_4 and PX_8 successively arranged along the X-axis be taken for example. The active element 123 occupies a relative position at the bottom-right corner in the pixel region PX_1. The active element 123 occupies a relative position at the bottom-left corner in the pixel region PX_2. The active element 123 occupies a relative position at the top-left corner in the pixel region PX_3. The active element 123 occupies a relative position at the top-right corner in the pixel region PX_4. Thus, relative positions of the transparent region t1 in the pixel region PX_1, the transparent region t1 in the pixel region PX_2, the transparent region t1 in the pixel region PX_3 and the transparent region t1 in the pixel region PX_4 are different. Although both the relative position of the active element 123 in the pixel region PX_3 and the relative position the active element 123 in the pixel region PX_8 are at the top left corner, the position of the capacitor electrode 124 (the opaque region) in the pixel region PX_3 is different from the position of the capacitor electrode 124 (the opaque region) in the pixel region PX_8, and the relative position of the transparent region t1 in the pixel region PX_3 is different from the relative position of the transparent region t1 in the pixel region PX_8. Thus, relative positions of the transparent regions t1 in the five pixel regions PX_1, PX_2, PX_3, PX_4 and PX_8 successively arranged along the X-axis are different.

FIGS. 2~6 are top views of a transparent display panel according to several embodiments of the disclosure. The transparent display panel 200 includes a first substrate 110, a pixel array 120, a second substrate (not illustrated) and a liquid crystal layer (not illustrated), wherein the liquid crystal layer is formed between the first substrate 110 and the second substrate. The pixel array 120 is formed on the first substrate 110, and includes a plurality of data lines 121 and a plurality of scan lines 122. The scan lines 122 and the data lines 121 surround a plurality of pixel regions PX, which are separated from each other by the scan lines 122 and the data lines 121. Each pixel region PX includes an opaque region t2, wherein the opaque region t2 includes all light-impassable parts of the pixel region PX, such as active elements, capacitor electrodes, black matrixes, data lines, scan lines, and other elements formed by metals or non-metals.

In the present embodiment, the design of having different relative positions for at least three opaque regions t2 successively arranged along an axial direction makes at least three transparent regions t1 successively arranged along an axial direction have different relative positions.

Figure 2:
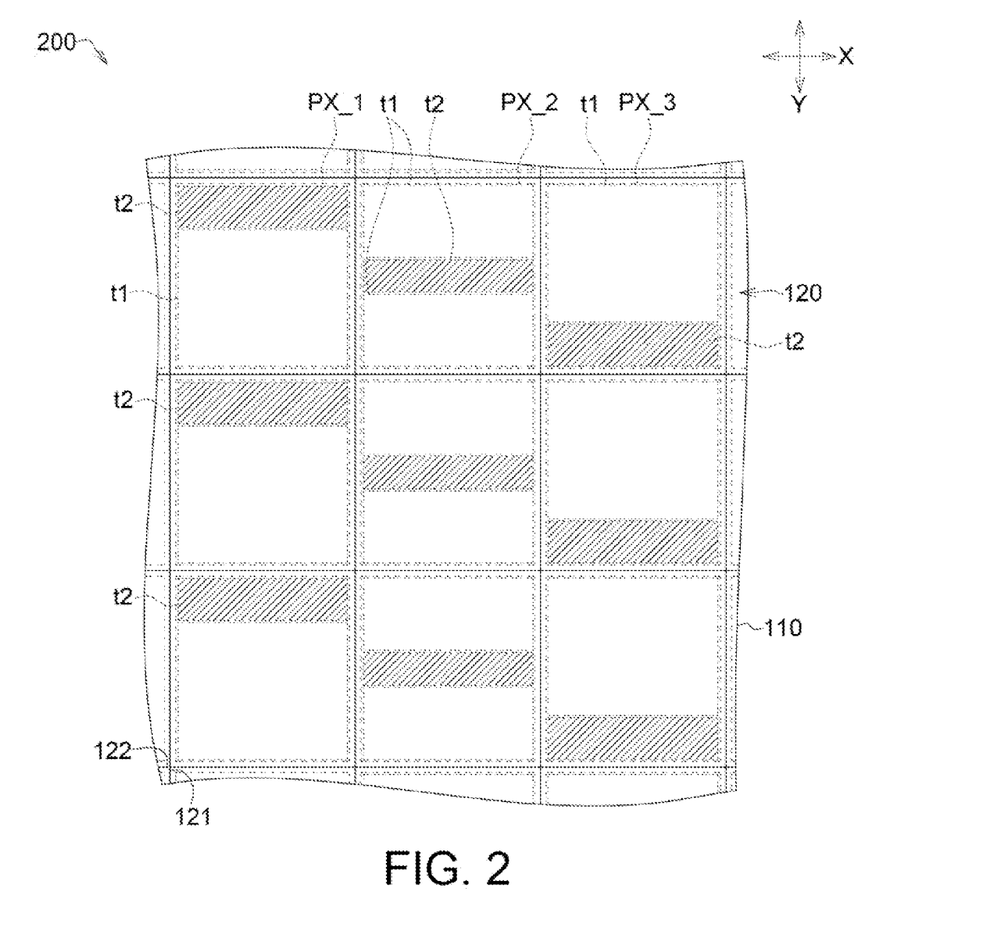
FIGS. 2~6 are top views of a transparent display panel according to several embodiments of the disclosure.

Refer to FIG. 2. Let the three pixel regions PX_1, PX_2 and PX_3 successively arranged along the X-axis be taken for example. Relative positions of the opaque region t2 in the pixel region PX_1, the opaque region t2 in the pixel region PX_2 and the opaque region t2 in the pixel region PX_3 are different. For example, the relative position of the opaque region t2 in the pixel region PX_1 is deviated upward, the relative position of the opaque region t2 in the pixel region PX_2 is vertically centered, and the relative position of the opaque region t2 in the pixel region PX_3 is deviated downward, such that relative positions of the transparent region t1 in the pixel region PX_1, the transparent region t1 in the pixel region PX_2 and the transparent region t1 in the pixel region PX_3 are different, hence destroying the optical diffraction which occurs when the light penetrates the pixel regions.

Figure 3:
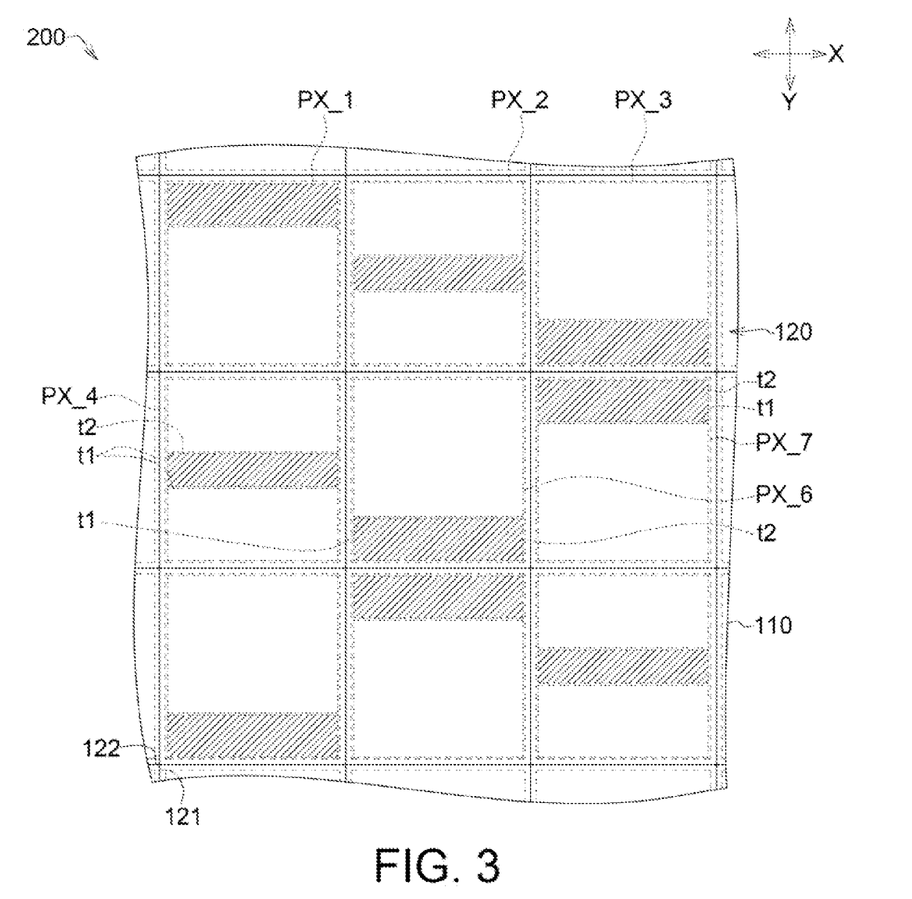

Refer to FIG. 3. Let the three pixel regions PX_4, PX_6 and PX_7 successively arranged along the X-axis be taken for example. Relative positions of the opaque region t2 in the pixel region PX_4, the opaque region t2 in the pixel region PX_6 and the opaque region t2 in the pixel region PX_7 are different. For example, the relative position of the opaque region t2 in the pixel region PX_4 is vertically centered, the relative position of the opaque region t2 in the pixel region PX_6 is deviated downward, and the relative position of the opaque region t2 in the pixel region PX_7 is deviated upward. Thus, relative positions of the transparent region t1 in the pixel region PX_4, the transparent region t1 in the pixel region PX_6 and the transparent region t1 in the pixel region PX_7 are different, hence destroying the optical diffraction which occurs when the light penetrates the pixel regions.

Figure 4:
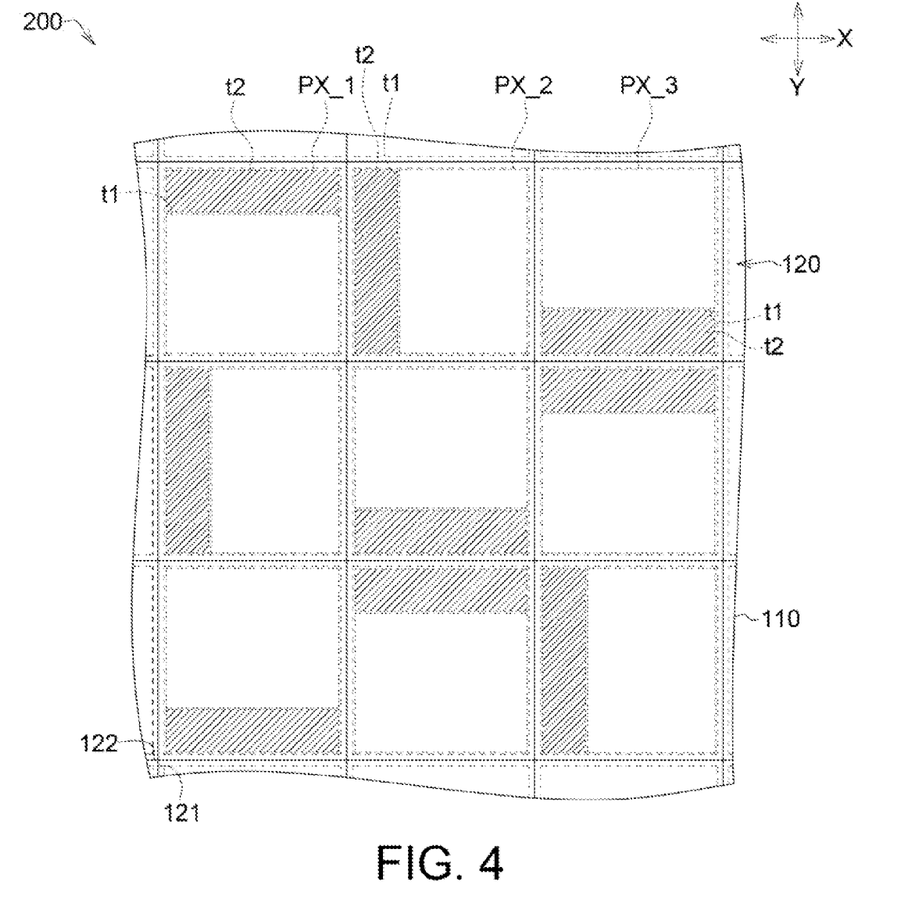

Refer to FIG. 4. Let the three pixel regions successively arranged along the X-axis PX_1, PX_2 and PX_3 be taken for example. Relative positions of the opaque region t2 in the pixel region PX_1, the opaque region t2 in the pixel region PX_2 and the opaque region t2 in the pixel region PX_3 are different. For example, the relative position of the opaque region t2 in the pixel region PX_1 is deviated upward, the relative position of the opaque region t2 in the pixel region PX_2 is deviated leftward, and the relative position of the opaque region t2 in the pixel region PX_3 is deviated downward. Thus, relative positions of the transparent region t1 in the pixel region PX_1, the transparent region t1 in the pixel region PX_2 and the transparent region t1 in the pixel region PX_3 are different, hence destroying the optical diffraction which occurs when the light penetrates the pixel regions.

Moreover, three pixel regions are successively arranged along the same axial direction, and each opaque region t2 in the three pixel region can extend along the same axial direction or along an axial direction perpendicular to the same axial direction. Let the pixel regions PX_1, PX_2 and PX_3 arranged along the X-axis be taken for example. The long axis of the opaque region t2 in the pixel region PX_1 and the long axis of the opaque region t2 in pixel region PX_3 basically extend along the X-axis. The long axis of the opaque region t2 in pixel region PX_2 is basically perpendicular to the X-axis, that is, the long axis of the opaque region t2 in pixel region PX_2 extends along the Y-axis.

Figure 5:
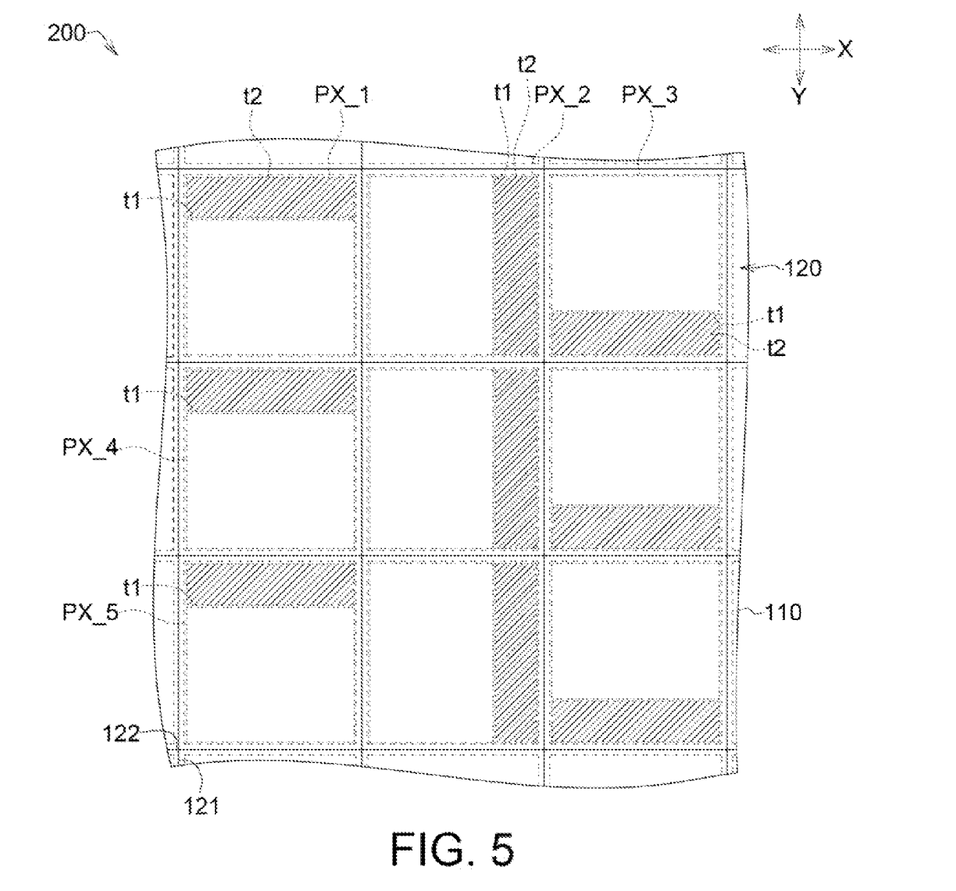

As indicated in FIG. 5, relative positions of a plurality of opaque regions t2 in a plurality of pixel regions PX successively arranged along the same axial direction are similar, but relative positions of a plurality of opaque regions t2 in a plurality of pixel regions PX successively arranged along the other axial direction are different. Let the three pixel regions PX_1, PX_4 and PX_5 successively arranged along the Y-axis be taken for example. Relative positions of the opaque region t2 in the pixel region PX_1, the opaque region t2 in the pixel region PX_4 and the opaque region t2 in the pixel region PX_5 all are deviated upward. Thus, relative positions of the transparent region t1 in the pixel region PX_1, the transparent region t1 in the pixel region PX_4 and the transparent region t1 in the pixel region PX_5 are basically the same. Let the three pixel regions successively arranged along the X-axis PX_1, PX_2 and PX_3 be taken for example. The relative position of the opaque region t2 in the pixel region PX_1 is deviated upward, the relative position of the opaque region t2 in the pixel region PX_2 is deviated rightward, but the relative position of the opaque region t2 in the pixel region PX_3 is deviated downward. Thus, relative positions of the transparent region t1 in the pixel region PX_1, the transparent region t1 in the pixel region PX_2 and the transparent region t1 in the pixel region PX_3 are different, hence destroying the optical diffraction which occurs when the light penetrates the pixel regions.

Figure 6:
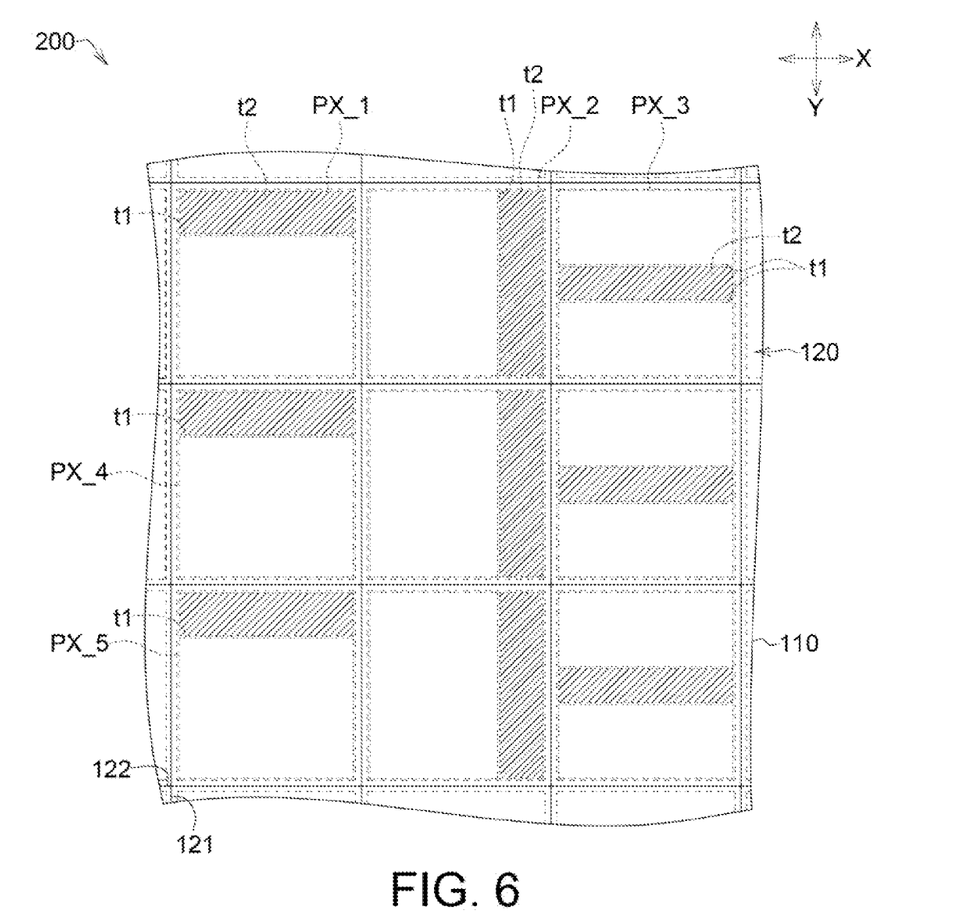

As indicated in FIG. 6, relative positions of a plurality of opaque regions t2 in a plurality of pixel regions PX successively arranged along the same axial direction are similar, but relative positions of a plurality of opaque regions t2 in a plurality of pixel regions PX successively arranged along another axial direction are different. Let the three pixel regions PX_1, PX_4 and PX_5 successively arranged along the Y-axis be taken for example. Relative positions of the opaque region t2 in the pixel region PX_1, the opaque region t2 in the pixel region PX_4 and the opaque region t2 in the pixel region PX_5 are deviated upward. Thus, relative positions of the transparent region t1 in the pixel region PX_1, the transparent region t1 in the pixel region PX_4 and the transparent region t1 in the pixel region PX_5 are basically the same. Let the three pixel regions PX_1, PX_2 and PX_3 successively arranged along the X-axis be taken for example. Relative position of the opaque region t2 in the pixel region PX_1 is deviated upward, relative position of the opaque region t2 in the pixel region PX_2 is deviated rightward, and relative position of the opaque region t2 in the pixel region PX_3 is vertically centered. Thus, relative positions of the transparent region t1 in the pixel region PX_1, the transparent region t1 in the pixel region PX_2 and the transparent region t1 in the pixel region PX_3 are different, hence destroying the optical diffraction which occurs when the light penetrates the pixel regions.

To summarize, the distribution of light-impassable elements (such as active elements, capacitor electrodes, black matrixes and/or other impassable materials) define the opaque regions t2 in the pixel regions PX, and the distribution of light-passable elements (such as transparent pixel electrodes) and/or hollowed part(s) define the transparent regions t1 in the pixel regions PX. Relative positions of the opaque regions t2 in the pixel regions PX can be deviated upward, downward, leftward, or rightward, vertically centered or placed according to other relative relationships. Thus, relative positions of the transparent regions t1 can be determined. Any relative positions will do as long as the relative positions of the transparent regions t1 in at least three pixel regions PX successively arranged along the same axial direction (such as along the X-axis or the Y-axis) are different, or as long as the centroid coordinates of the transparent regions t1 in at least three pixel regions PX successively arranged along the same axial direction (such as the X-axis or the Y-axis) are different. Relative position, area and/or shapes of the transparent region t1 in the pixel region PX is not subjected to specific restrictions in the embodiments of the disclosure.

Figure 7A:
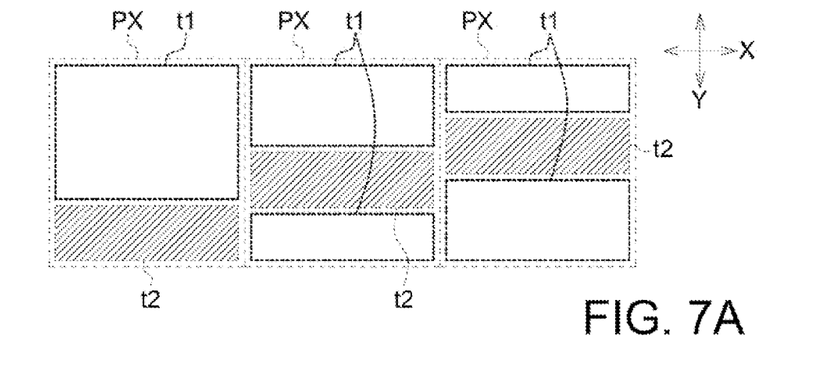
FIGS. 7A~7C are schematic diagrams of relative positions of three successively arranged transparent regions according to an embodiment of the disclosure.
Figure 7B:
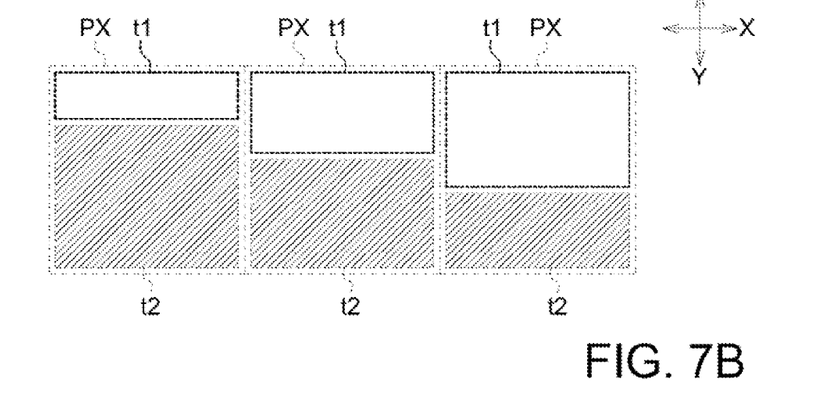
Figure 7C:
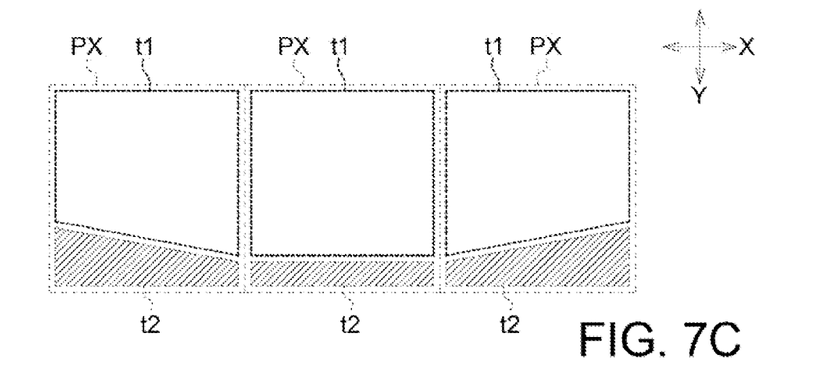

FIGS. 7A~7C are schematic diagrams of relative positions of three successively arranged transparent regions t1 according to an embodiment of the disclosure. Each pixel region PX defines a transparent region t1 and an opaque region t2, and any parts other than the opaque region t2 belong to the transparent region t1. That is, in the pixel region PX, the transparent region t1 and the opaque region t2 are complementary to each other.

As indicated in FIG. 7A, the transparent regions t1 in the three pixel regions PX successively arranged along the same axial direction basically have the same area but are distributed in different regions, hence having different relative positions. As indicated in FIG. 7B, the transparent regions t1 in the three pixel regions PX successively arranged along the same axial direction have different areas, hence having different relative positions. As indicated in FIG. 7C, the transparent regions t1 in the three pixel regions PX successively arranged along the same axial direction have different shapes, hence having different relative positions. As indicated in FIG. 7C, one side of the transparent region t1 is a hypotenuse. In another embodiment, at least one side of the transparent region t1 is a hypotenuse or an arced edge.

Figure 8A:
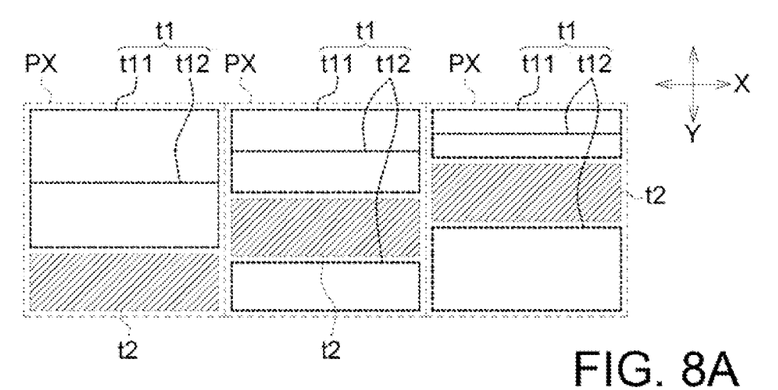
FIGS. 8A~8C are schematic diagrams of relative positions of three successively arranged transparent regions according to another embodiment of the disclosure.
Figure 8B:
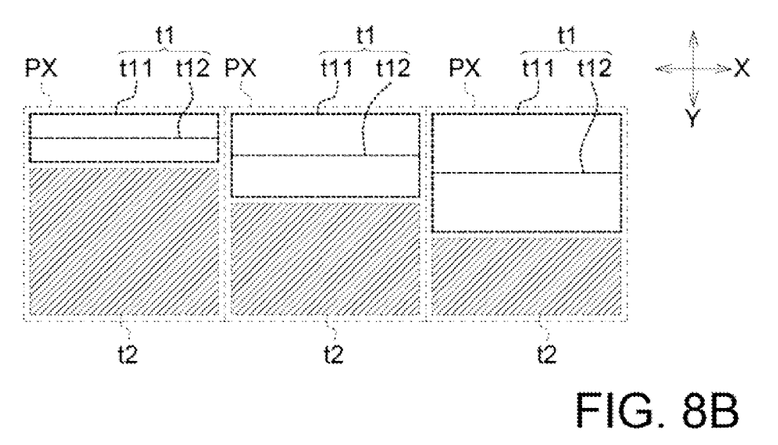
Figure 8C:
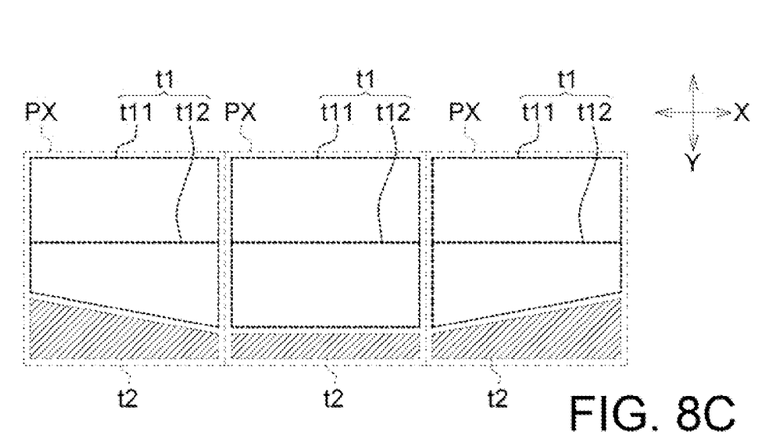

FIGS. 8A~8C are schematic diagrams of relative positions of three successively arranged transparent regions t1 according to another embodiment of the disclosure. Each pixel region PX defines a transparent region t1 and an opaque region t2, and any parts other than the opaque region t2 belong to the transparent region t1.

In the present embodiment, the transparent region t1 includes a first transparent region t11 and a second transparent region t12. The transmittance of the first transparent region t11 is greater than that of the second transparent region t12. For example, when the transmittance of the first transparent region t11 is greater than 50% and the transmittance of the second transparent region t12 is less than 50%, the overall transmittance of the transparent region t1 in the pixel region PX still can be greater than or substantially equivalent to 30%.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A transparent display panel, comprising:
   a substrate; and
   a pixel array formed on the substrate and comprising:
      a plurality of data lines; and
      a plurality of scan lines, wherein the scan lines and the data lines surround a plurality of pixel regions separated from each other, each pixel region comprises an opaque region and a transparent region, and wherein each transparent region has an area equivalent to at least 50% of the corresponding pixel region, has a transmittance greater than or substantially equivalent to 30% and occupies a relative position in the corresponding pixel region, and wherein at least three relative positions successively arranged along an axial direction are different.

2. The transparent display panel according to claim 1, wherein the pixel array further comprises:
   a plurality of active elements, wherein one of the plurality of active elements located in the corresponding opaque region.

3. The transparent display panel according to claim 1, wherein the pixel array further comprises:
   a plurality of capacitor electrodes, wherein one of the plurality of capacitor electrodes located in the corresponding opaque region.

4. The transparent display panel according to claim 1, wherein the pixel array further comprises:
   a plurality of pixel electrodes, wherein each pixel electrode is located in the corresponding transparent region.

5. The transparent display panel according to claim 1, wherein an area of each pixel region is substantially the same.

6. The transparent display panel according to claim 1, wherein a shape of each pixel region is similar.

7. The transparent display panel according to claim 1, wherein N pixel regions are separated by N-m sets of different spaces, N is a positive integer equivalent to or greater than 3, and m is a positive integer between N-2 and 1.

8. The transparent display panel according to claim 7, wherein the N-m sets of different spaces change gradually.

9. The transparent display panel according to claim 1, wherein the relative position of each transparent region in the corresponding pixel region is a centroid position.

10. The transparent display panel according to claim 1, wherein a plurality of relative positions successively arranged along another axial direction are substantially the same.

11. The transparent display panel according to claim 1, wherein the transparent region further comprises a first transparent region and a second transparent region, and the transmittance of the first transparent region is greater than that of the second transparent region.

12. The transparent display panel according to claim 11, wherein the first transparent region has a transmittance greater than 50%.

13. The transparent display panel according to claim 1, wherein the areas of the at least three pixel regions successively arranged along the axial direction are substantially the same.

14. The transparent display panel according to claim 1, wherein at least one side of each transparent region is a hypotenuse or an arced edge.

15. A transparent display panel, comprising:
   a substrate; and
   a pixel array formed on the substrate and comprising:
      a plurality of data lines; and
      a plurality of scan lines, wherein the scan lines and the data lines surround a plurality of pixel regions separated from each other, each pixel region comprises an opaque region and a transparent region, and wherein each transparent region has an area equivalent to at least 50% of the corresponding pixel region, has a transmittance greater than or substantially equivalent to 30% and occupies a relative position in the corresponding pixel region, and wherein at least four relative positions successively arranged along an axial direction are different.

* * * * *